(12) United States Patent
Mori

(10) Patent No.: US 11,462,387 B2
(45) Date of Patent: Oct. 4, 2022

(54) SUBSTRATE PROCESSING APPARATUS AND SUBSTRATE PROCESSING METHOD

(71) Applicant: ASM IP Holding B.V., Almere (NL)

(72) Inventor: Yukihiro Mori, Machida (JP)

(73) Assignee: ASM IP Holding B.V., Almere (NL)

( * ) Notice: Subject to any disclaimer, the term of this patent is extended or adjusted under 35 U.S.C. 154(b) by 513 days.

(21) Appl. No.: 15/954,903

(22) Filed: Apr. 17, 2018

(65) Prior Publication Data

US 2019/0318910 A1    Oct. 17, 2019

(51) Int. Cl.

| | |
|---|---|
| *H01L 21/00* | (2006.01) |
| *H01J 37/32* | (2006.01) |
| *H01L 21/3065* | (2006.01) |
| *H01L 21/67* | (2006.01) |
| H01L 21/3213 | (2006.01) |
| H01L 21/311 | (2006.01) |

(52) U.S. Cl.
CPC .... *H01J 37/32082* (2013.01); *H01J 37/3244* (2013.01); *H01J 37/32568* (2013.01); *H01L 21/3065* (2013.01); *H01L 21/67069* (2013.01); *H01J 2237/334* (2013.01); *H01J 2237/3321* (2013.01); *H01L 21/31116* (2013.01); *H01L 21/31138* (2013.01); *H01L 21/32136* (2013.01)

(58) Field of Classification Search
CPC ............ H01L 21/02087; H01L 21/0209
See application file for complete search history.

(56) References Cited

U.S. PATENT DOCUMENTS

| | | | | |
|---|---|---|---|---|
| 7,628,864 | B2* | 12/2009 | Moriya ............. | H01J 37/32082 134/1 |
| 8,100,081 | B1* | 1/2012 | Henri ........................ | C23F 4/00 118/723 ER |
| 8,308,896 | B2* | 11/2012 | Kim .................. | H01J 37/32357 156/345.3 |
| 2002/0148561 | A1* | 10/2002 | Tetsuhiro ................ | C23C 16/52 156/345.26 |
| 2007/0062647 | A1* | 3/2007 | Bailey ............... | H01L 21/02087 156/345.33 |
| 2008/0179289 | A1* | 7/2008 | Collins ............. | H01J 37/32357 216/67 |

(Continued)

FOREIGN PATENT DOCUMENTS

JP    2011-511437 A    4/2011

OTHER PUBLICATIONS

CN-101477945-A Ni et al., Polymer depostion preventing/reducing method for substrate during etching process, involves blowing auxiliary gas as reaction gas from edge or back of substrate to prevent generation of polymer deposition at back of substrate., Jul. 9, 2009, Advanced Micro Fab Shanghai Inc., absract.*

(Continued)

*Primary Examiner* — Sylvia MacArthur
*Assistant Examiner* — Michelle Crowell
(74) *Attorney, Agent, or Firm* — Studebaker & Brackett PC

(57) ABSTRACT

Examples of a substrate processing apparatus include a stage, an outer peripheral ring that surrounds the stage while provided with a gap between a side surface of the stage and the outer peripheral ring, a gas supply unit configured to supply gas from a lower side of the gap to an upper side of the gap, and an upper electrode provided above the stage.

14 Claims, 7 Drawing Sheets
(1 of 7 Drawing Sheet(s) Filed in Color)

(56) References Cited

U.S. PATENT DOCUMENTS

| | | | | |
|---|---|---|---|---|
| 2008/0179297 A1* | 7/2008 | Bailey | ............... | H01J 37/32366 |
| | | | | 219/69.15 |
| 2009/0188627 A1* | 7/2009 | Fang | ................. | H01J 37/32091 |
| | | | | 156/345.43 |
| 2009/0293907 A1* | 12/2009 | Fung | ....................... | G03F 7/427 |
| | | | | 134/1.2 |
| 2011/0024399 A1* | 2/2011 | Kim | .................. | H01J 37/32009 |
| | | | | 219/121.41 |
| 2014/0007901 A1* | 1/2014 | Chen | ................. | H01L 21/67028 |
| | | | | 134/1.1 |
| 2015/0020848 A1* | 1/2015 | Kim | .................. | H01J 37/32403 |
| | | | | 134/1.2 |
| 2015/0332949 A1* | 11/2015 | Mori | ....................... | C23C 16/04 |
| | | | | 427/579 |
| 2016/0237559 A1* | 8/2016 | Tsuji | .................... | C23C 16/4412 |

OTHER PUBLICATIONS

CN101477945A, Ni et al., Jul. 8, 2009, Advanced Micro Fab Equip Inc., p. 5. (Year: 2009).*

* cited by examiner

O₂ Gas supplied from lower side

O₂ Gas supplied from upper side

SUBSTRATE PROCESSING APPARATUS AND SUBSTRATE PROCESSING METHOD

TECHNICAL FIELD

Examples are described which relate to a substrate processing apparatus and a substrate processing method.

BACKGROUND

In a manufacturing process of a semiconductor or liquid crystal, a substrate is conveyed while the outer peripheral portion of the substrate is clamped, or the hand of a transfer robot is brought into mechanical contact with the back surface of the substrate. As a result, the substrate of silicon or the like is scraped, resulting in occurrence of minute particles. Furthermore, when a thin film is formed on a substrate, a film creeping around to a side surface portion of the substrate and depositing there peels off due to the contact during the foregoing substrate conveyance, which causes occurrence of minute particles. In particular, a film having stress in a tensile direction tends to peel off the substrate.

In addition, a conductive film creeping around to an outer peripheral portion of the back surface of the substrate disturbs electrostatic adsorption to be performed on the substrate in a subsequent step, or generates direct current penetrating through the substrate longitudinally, which causes damage to elements. These problems cause electrical defects in highly integrated devices and greatly reduce the yield.

In order to prevent or reduce particles occurring due to the mechanical contact with the outer peripheral portion of the substrate, a method for selectively removing the film at the outer peripheral portion of the substrate is used. Patent Literature 1 (JP2011-511437A) discloses, as an example of such a method, a plasma etching processing chamber which is configured to etch a thin film on a bevel edge portion of a substrate.

In the etching chamber disclosed in Patent Literature 1, it is impossible to efficiently guide reaction gas to the back surface side of the substrate, so that it is difficult to remove a film on the back surface of the substrate. Therefore, there is a case where a film on the side surface or back surface of the substrate peels off in a reactor chamber, so that particles occur. Furthermore, in an apparatus disclosed in Patent Literature 1, reaction gas goes around onto a film on the surface side which must be left to protect elements formed on the surface of the substrate, and thus the film thickness of the film on the surface side decreases, so that the yield of elements at the outer peripheral portion decreases.

SUMMARY

Some examples described herein may address the above-described problems. Some examples described herein may provide a substrate processing apparatus and a substrate processing method that can suppress occurrence of particles which is caused by peel-off of a film on the side surface or back surface of a substrate.

In some examples, a substrate processing apparatus may include a stage, an outer peripheral ring that surrounds the stage while provided with a gap between a side surface of the stage and the outer peripheral ring, a gas supply unit configured to supply gas from a lower side of the gap to an upper side of the gap, and an upper electrode provided above the stage.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Figure 1:
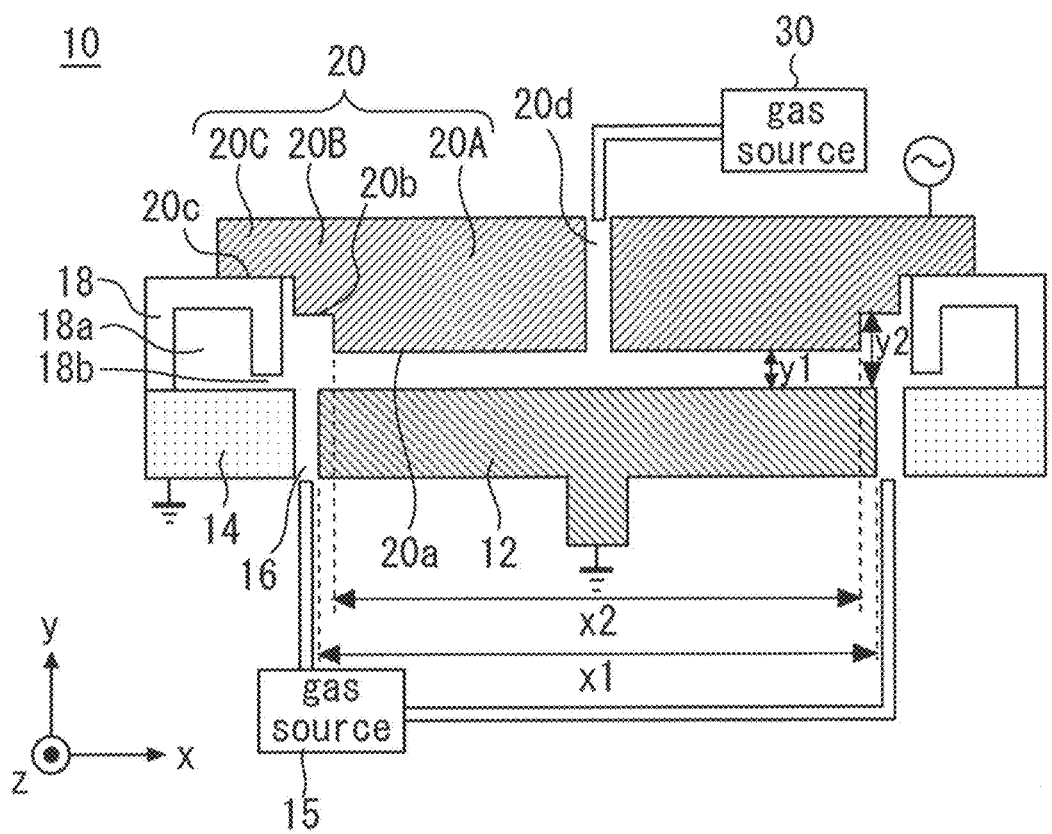
FIG. 1 is a diagram showing an example of a substrate processing apparatus.

FIG. 1 is a diagram showing an example of a substrate processing apparatus. The substrate processing apparatus 10 includes a stage 12. The stage 12 may be configured by a metal material which is grounded, for example, by connecting the metal material to a chamber or the like. When a wafer of 300 mm is placed on the stage 12, the diameter X1 of the stage 12 is set to be less than 300 mm. Substrates other than the wafer of 300 mm may be placed on the stage 12, but the diameter X1 of the stage 12 is set to be less than the diameter of a substrate to be placed on the stage 12.

This stage 12 is surrounded by an outer peripheral ring 14. The outer peripheral ring 14 surrounds the stage 12 while providing a gap 16 between the outer peripheral ring 14 and the side surface of the stage 12. Accordingly, the gap 16 has an annular shape in plan view. The gap 16 enables gas supply from the lower side of the stage 12 to the upper side of the stage 12. The gas supply as described above can be performed by a gas supply unit (gas source) 15, for example. The gas supply unit 15 supplies gas from the lower side of the gap 16 to the upper side of the gap 16. The gas to be supplied by the gas supply unit 15 is gas for etching a film formed on a substrate or gas used for film formation. The gas supply unit 15 supplies reaction gas such as $O_2$ gas, for example. Gas containing $O_2$ gas may be used as reaction gas. Any reaction gas enabling etching or film formation may be used.

The outer peripheral ring 14 may be configured by a metal material which is grounded, for example, by connecting the metal material to the chamber or the like. An exhaust duct 18 is provided above the outer peripheral ring 14. The exhaust duct 18 has such an annular shape as to surround the stage 12 in plan view. The exhaust duct 18 provides an exhaust passage through which gas in a space surrounded by the exhaust duct 18 is exhausted to the outside. The gas in the space surrounded by the exhaust duct 18 is, for example, gas above the stage 12. The gas, etc. above the stage 12 are led from an inlet 18b of the exhaust duct 18 to an annular channel 18a, and exhausted to the outside.

An upper electrode 20 is mounted on the exhaust duct 18. The upper electrode 20 is provided above the stage 12 as a whole. The upper electrode 20 includes a first part 20A, a second part 20B surrounding the first part 20A, and a third part 20C surrounding the second part 20B. The first part 20A, the second part 20B and the third part 20C are formed of metal or conductor, for example. The first part 20A has a first bottom surface 20a confronting the stage 12. The second part 20B has a second bottom surface 20b. The distance in height from the top surface of the stage 12 to the first bottom surface 20a is represented by y1. The distance in height from the top surface of the stage 12 to the second bottom surface 20b is represented by y2. The distance y2 is larger than the distance y1. Therefore, the second bottom surface 20b is at a position higher than the first bottom surface 20a. The third bottom surface 20c of the third part 20C is mounted on the exhaust duct 18, whereby the position of the upper electrode 20 is settled and the distances y1 and y2 are fixed.

The diameter X2 of the first bottom surface 20a may be set in the range from a value larger than the diameter X1 of the stage 12 by 10 mm to a value smaller than the diameter X1 of the stage 12 by 10 mm, for example. It is shown in FIG. 1 that the diameter X2 of the first bottom surface 20a is smaller than the diameter X1 of the stage 12. Since plasma is generated mainly between the second bottom surface 20b and each of the stage 12 and the outer peripheral ring 14, the range of plasma can be enlarged or restricted by adjusting the diameter of the first bottom surface 20a.

A high frequency power source is connected to the upper electrode 20. The high frequency power source supplies the upper electrode 20 with high frequency power necessary to generate plasma. For example, the upper electrode 20 is supplied with power in the range from 100 watts to 2000 watts at the frequency range from 2 MHz to 60 MHz.

An upper electrode through-hole 20d is formed in the upper electrode 20 so as to penetrate through the upper electrode 20. The upper electrode through-hole 20d may be provided just above the center of the stage 12. For example, inert gas can be supplied from the upper side of the upper electrode through-hole 20d to the lower side of the upper electrode through-hole 20d by providing an inert gas supply unit (gas source) 30 to the outside of the chamber. In some examples, a plurality of the upper electrode through-holes 20d may be formed in the upper electrode 20.

Figure 2:
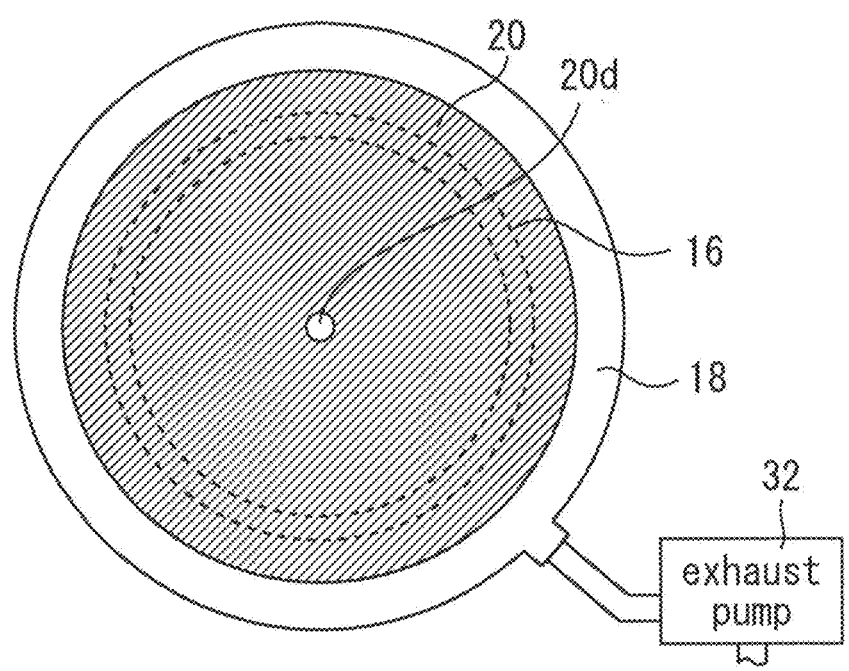
FIG. 2 is a plan view showing the upper electrode and the exhaust duct.

FIG. 2 is a plan view showing the upper electrode 20 and the exhaust duct 18. Gas in the annular channel of the exhaust duct 18 is exhausted to the outside by an exhaust pump 32. The gap 16 is represented by broken lines in FIG. 2, and the gap 16 has an annular shape in plan view. The gas supply unit 15 described above supplies the whole gap 16 with gas under substantially uniform pressure.

Figure 3:
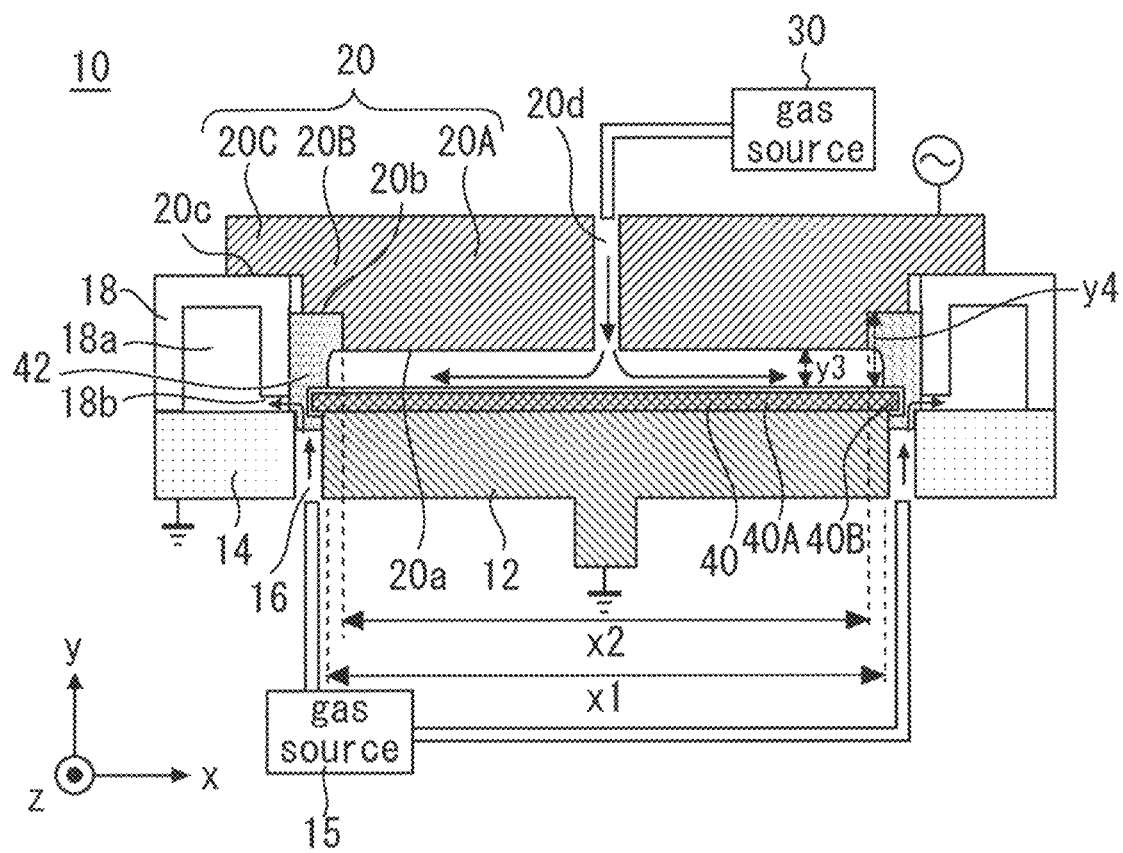
FIG. 3 is a diagram showing a substrate processing method.
Figure 4:
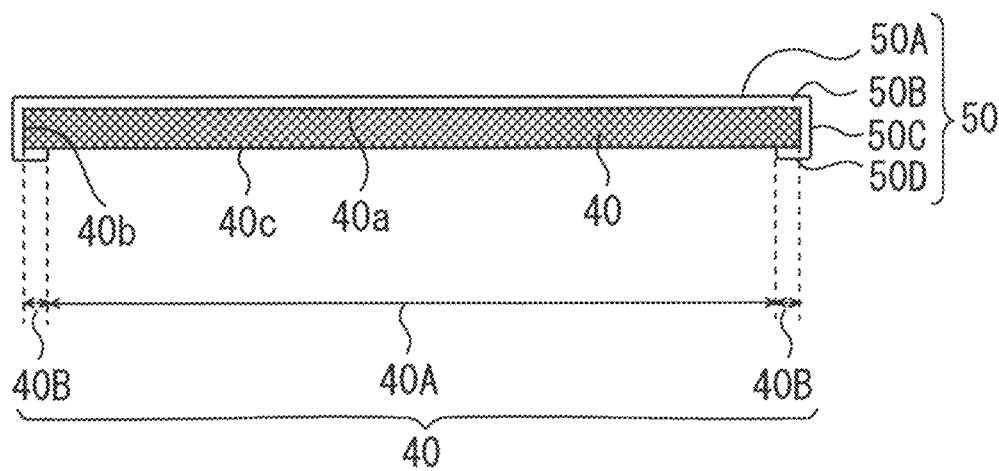
FIG. 4 is an enlarged view of the substrate.

FIG. 3 is a diagram showing a substrate processing method using a substrate processing apparatus 10 of FIG. 1. In this example, films on the side surface and back surface of a substrate are removed. First, a substrate 40 is placed on the stage 12. FIG. 4 is an enlarged view of the substrate 40 of FIG. 3. The substrate 40 has a center portion 40A, and an enclosing portion 40B which encloses the center portion 40A. The enclosing portion 40B is a portion for enclosing the center portion 40A annularly. When viewed from a different angle, the substrate 40 includes an upper surface 40a, a side surface 40b and a lower surface 40c. A film 50 is formed on the substrate 40. The film 50 has a first film 50A on the upper surface of a center portion 40A, a second film 50B on the upper surface of the enclosing portion 40B, a third film 50C on the side surface of the enclosing portion 40B, and a fourth film 50D on the back surface of the enclosing portion 40B.

In normal film formation, film formation on the lower surface 40c of the substrate 40 is not intended. However, for example, in the case of ALD (Atomic Layer Deposition) or the like, gas molecules infiltrate into the gap between the lower surface 40c and a susceptor, and a film is liable to be formed on the lower surface 40C. As a result, there is a fourth film 50D on the lower surface 40c of the enclosing portion 40B whereas there is no film on the lower surface 40c of the center portion 40A.

Returning to FIG. 2, only the center portion 40A of the substrate 40 is placed on the stage 12. The enclosing portion 40B protrudes to the outside of the stage 12. When a wafer of 300 mm is used as the substrate 40, the enclosing portion 40B can be made to protrude to the outside of the stage 12 by setting the diameter X1 of the stage 12 to less than 300 mm. By making the enclosing portion 40B protrude to the outside of the stage 12, the enclosing portion 40B is located just above the gap 16.

Subsequently, the processing is advanced to plasma processing. In the plasma processing, inert gas is supplied downwards from the upper side of the upper electrode through-hole 20d by the inert gas supply unit 30 while reaction gas is supplied upwards from the lower side of the gap 16 by the gas supply unit 15. The reaction gas which is supplied upwards from the lower side of the gap 16 by the gas supply unit 15 flows from the lower side of the enclosing portion 40B around the enclosing portion 40B, passes through the inlet 18b, and then is exhausted from the annular channel 18a. Furthermore, the inert gas which is supplied downwards from the upper side of the upper electrode through-hole 20d by the inert gas supply unit 30 spreads radially from a position just above the center of the substrate 40, passes through the space between the first bottom surface 20a and the substrate 40, enters the annular channel 18a from the inlet 18b, and then is exhausted.

High frequency power is applied to the upper electrode 20 under the state that gas flow as described above is formed. As a result, plasma 42 is generated on the back surface side of the enclosing portion 40B and on the side surface side of the enclosing portion 40B, thereby subjecting the enclosing portion 40B to plasma processing. Since the enclosing portion 40B protrudes to the outside of the stage 12, the back surface of the enclosing portion 40B is efficiently exposed to plasma generated with the reaction gas.

(Consideration on Gas Flow)

Figure 5A:
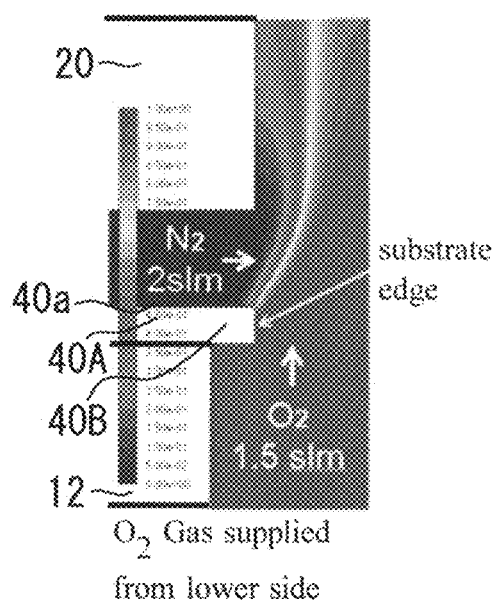
FIG. 5A is a diagram showing simulation result of the gas density.
Figure 5B:
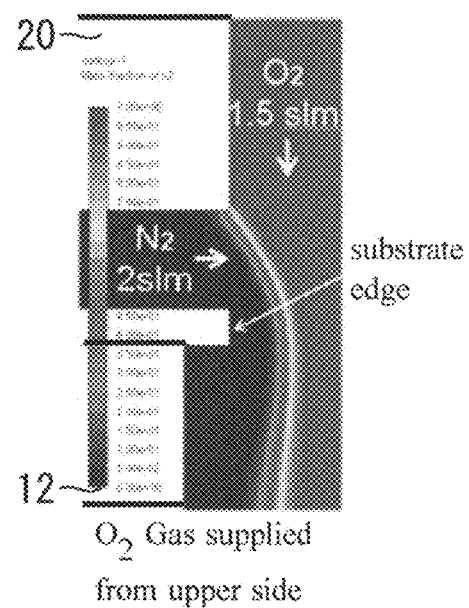
FIG. 5B is a diagram showing simulation result of the gas density.

FIGS. 5A and 5B are diagrams showing simulation results of the gas density. FIG. 5A is a diagram showing an aspect of gas flow when $N_2$ gas of 2 slm is used as inert gas flowing radially along the surface of the stage 12, and $O_2$ gas of 1.5 slm is used as reaction gas supplied from the lower side of the enclosing portion 40B. In this case, it is confirmed that the reaction gas can be efficiently supplied to the back surface of the substrate 40, and also the reaction gas can be suppressed from flowing around to the surface of the substrate 40. On the other hand, FIG. 5B shows the gas density when reaction gas is made to flow from the upper side of the stage 12. In this case, $O_2$ gas as the reaction gas is not sufficiently supplied to the back surface of the substrate 40.

In both the cases of FIGS. 5A and 5B, the reaction gas can be prevented from reaching the upper surface 40a of the substrate 40 by supplying inert gas from the center side of the substrate 40 to the outer peripheral side thereof. However, the reaction gas can be more efficiently supplied onto the back surface of the substrate 40 by supplying the reaction gas from the lower side of the substrate 40 as compared with the case where the reaction gas is supplied from the upper side of the substrate 40.

(Consideration on Plasma Generating Region)

FIG. 3 shows that plasma 42 is formed only around the enclosing portion 40B, and no plasma is formed just above the center portion 40A. Even when significant supply of the reaction gas to the position just above of the center portion 40A is suppressed, the first film 50A would be affected if Ar plasma caused by inert gas exists at this portion.

Figure 6:
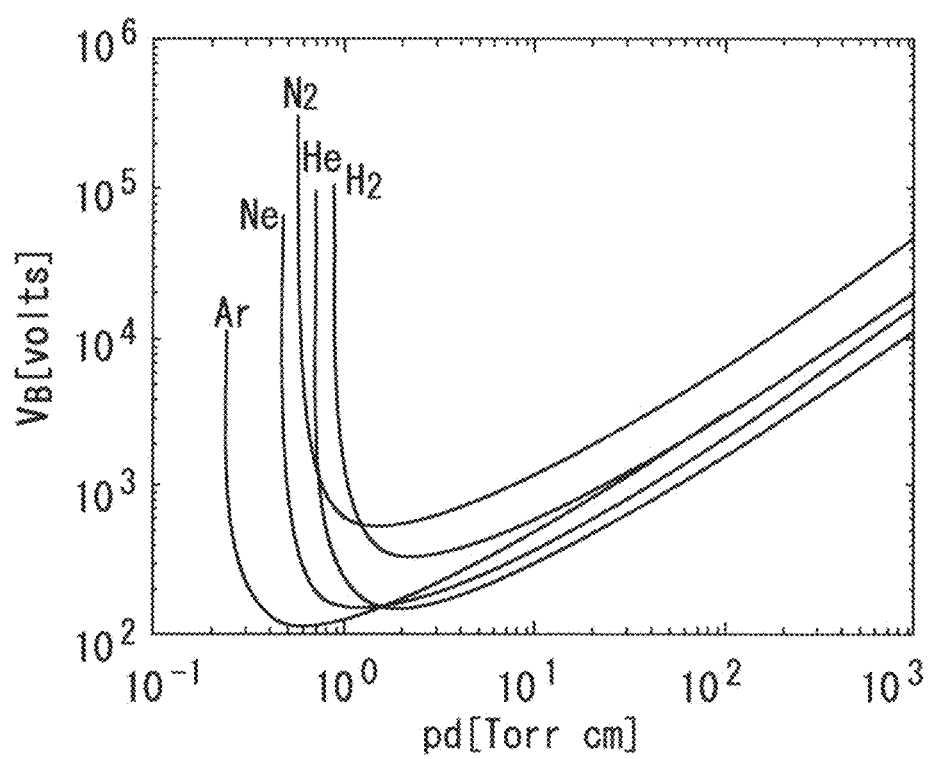
FIG. 6 shows curves given by Paschen's law.

In order to prevent or alleviate the above situation, the distance y3 between the first bottom surface 20a and the center portion 40A may be set to a distance at which no discharge occurs based on the Paschen's law. An ignition voltage of plasma conforms to the Paschen's law as shown in FIG. 6, for example. In FIG. 6, p represents the pressure in a reactor, and d represents the interval between electrodes. The ignition voltage $V_B$ is a function of the product pd of p and d. Therefore, ignition of plasma is suppressed by reducing or increasing the distance y3 between the first bottom surface 20a and the center portion 40A while the distance y4 between the enclosing portion 40B and the second bottom surface 20b shown in FIG. 3 is set to an optimum value for ignition of plasma, thereby making it possible in some examples to selectively generate plasma. That is, occurrence of plasma just above the center portion 40A can be suppressed while generating plasma around the enclosing portion 40B. As described above, the gap between the first bottom surface 20a and the stage 12 is used for supply of inert gas, and also set so as to be capable of suppressing generation of plasma. By suppressing generation of plasma between the first bottom surface 20a and the stage 12, the first film 50A formed on the upper surface of the substrate 40 can be prevented from being etched or modified at least to some extent.

Figure 7:
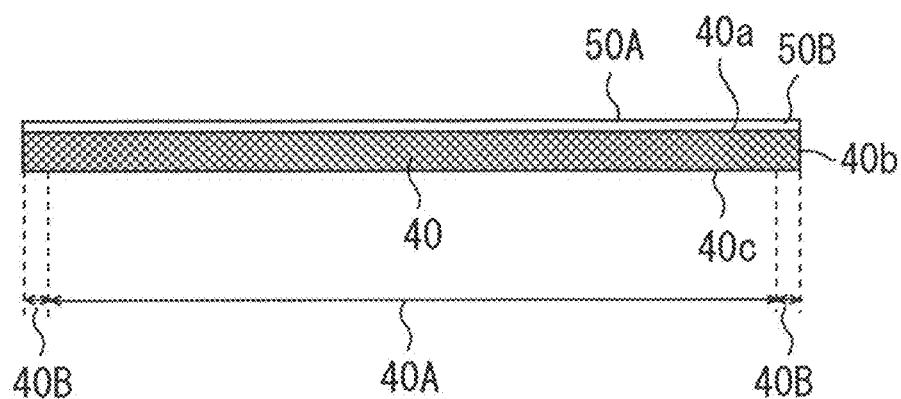
FIG. 7 is an ideal cross-sectional view of the substrate after the plasma processing.

The plasma processing is performed based on the foregoing consideration on the gas flow and the foregoing consideration on the plasma generating region. FIG. 7 is an ideal cross-sectional view of the substrate 40 after the plasma processing. The third film 50C and the fourth film 50D are removed by the plasma processing while the first film 50A and the second film 50B are left. As a result, the film can be left only on the upper surface 40a of the substrate 40.

Figure 8:
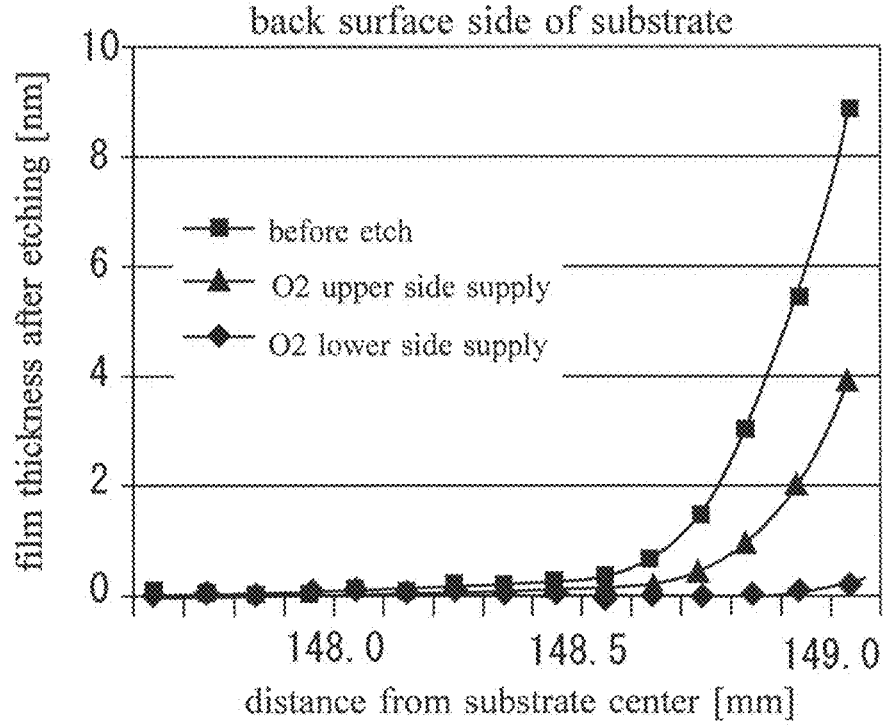
FIG. 8 shows a film thickness distribution on the back surface side of the substrate.
Figure 9:
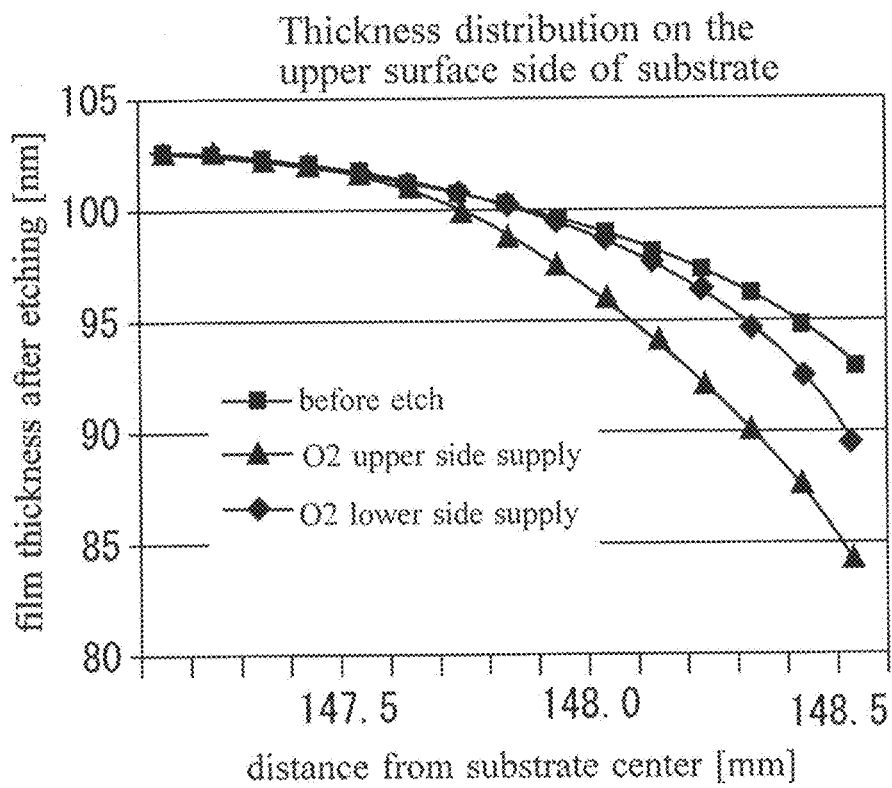
FIG. 9 shows a film thickness distribution on the upper surface side of the substrate.

FIGS. 8 and 9 are graphs showing experimental data representing the thickness of the film before and after the plasma processing on the back surface side and surface side of the substrate. The experimental data are obtained by placing, on a stage having an outer diameter of 295 mm, a silicon substrate of 300 mm on which an amorphous carbon coating is formed, and removing an outer peripheral film by oxygen plasmas. $O_2$ is supplied from the gap 16 having a width of 1 mm to generate oxygen plasma. $O_2$ is supplied at a substantially uniform density from the gap 16 which is annular in plan view. The distance y3 is set to 2 mm and the distance y4 is set to 18 mm in FIG. 3. High frequency power of 13.56 MHz and 500 W is applied to the upper electrode 20 to generate plasma only around the enclosing portion 40B of the substrate 40. The flow rate of supplied oxygen is set to 1 L/min., the temperature of the state 12 is set to 150° C., and the reaction pressure is set to 400 pa.

FIG. 8 shows a film thickness distribution on the back surface side of the substrate. From data of "before etching", it is apparent that a thicker film exists at a portion nearer to the outer peripheral side of the back surface before etching. Data of "$O_2$ upper side supply" are obtained by performing plasma processing while supplying oxygen gas from the upper side of the enclosing portion 40B. Data of "$O_2$ lower side supply" are obtained by performing plasma processing while supplying oxygen gas from the lower side of the enclosing portion 40B. That is, the data of "$O_2$ lower side supply" corresponds to the example of FIG. 3. Although the film on the back surface of the substrate can be removed to some degree even in the case of "$O_2$ upper side supply", but it is apparent that the film on the back surface of the substrate can more greatly removed in the case of "$O_2$ lower side supply" than that in the case of "$O_2$ upper side supply".

FIG. 9 shows a film thickness distribution on the upper surface side of the substrate. The film on the upper surface side of the substrate is a film indispensable for a device, and thus etching on the film should be suppressed. In the case of "$O_2$ lower side supply", the reduction amount of the film thickness can be suppressed as compared with that in the case of "before etching". On the other hand, in the case of "$O_2$ upper side supply", the reduction amount of the film thickness is larger than that in the case of "before etching".

From the results of FIGS. 8 and 9, when reaction gas is supplied from the lower side of the enclosing portion 40B according to the configuration of FIGS. 1 and 3, the film on the back surface can be more efficiently removed, and also the influence on the inside of the upper surface can be reduced as compared with the case where the reaction gas is supplied from the upper side of the substrate.

According to the substrate processing apparatus of this example, during the plasma processing, only the enclosing portion 40B is subjected to the plasma processing, and no significant plasma processing does not act on the center portion 40A. By performing the plasma processing based on the foregoing "Consideration on gas flow" and "Consideration on plasma generating region", the influence on the film on the upper surface of the substrate can be suppressed while removing the films on the side surface and back surface of the substrate.

Figure 10:
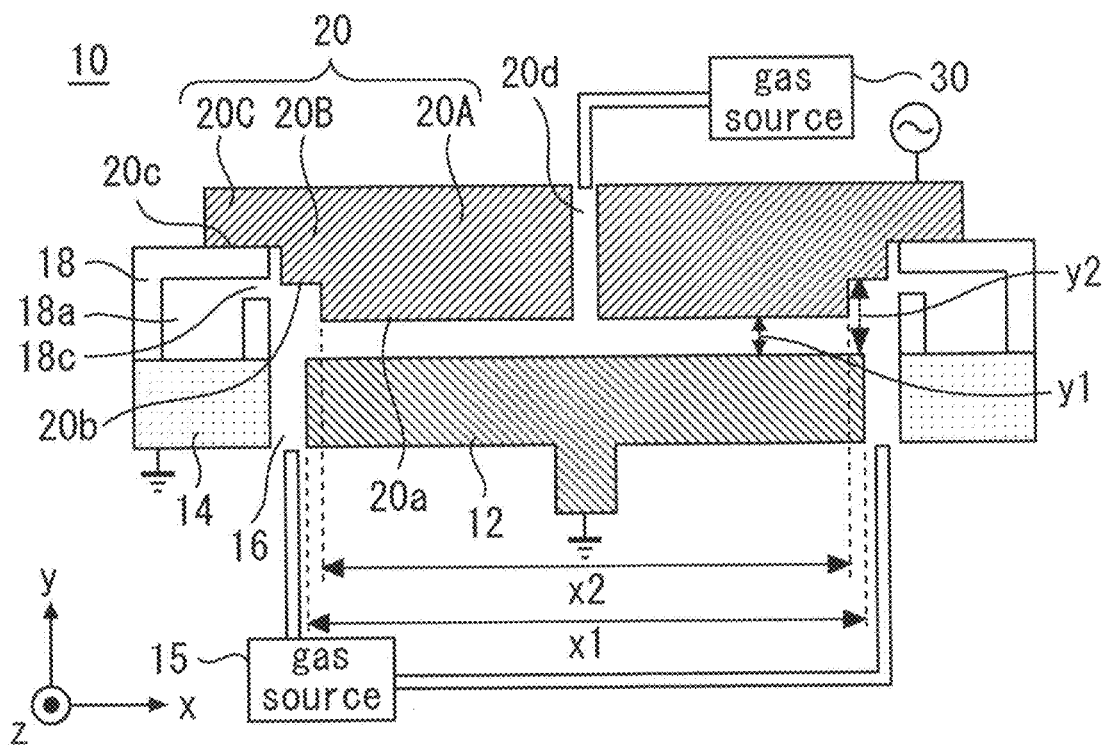
FIG. 10 is a cross-sectional view showing a substrate processing apparatus according to another example.

FIG. 10 is a cross-sectional view showing a substrate processing apparatus according to another example. An inlet 18c of the exhaust duct 18 is provided at a higher position than the inlet 18b of FIG. 1. The inlet to the exhaust duct 18 may be provided at any place. Reaction gas and inert gas used for generating plasma may be exhausted to the outside without the exhaust duct 18.

Figure 11:
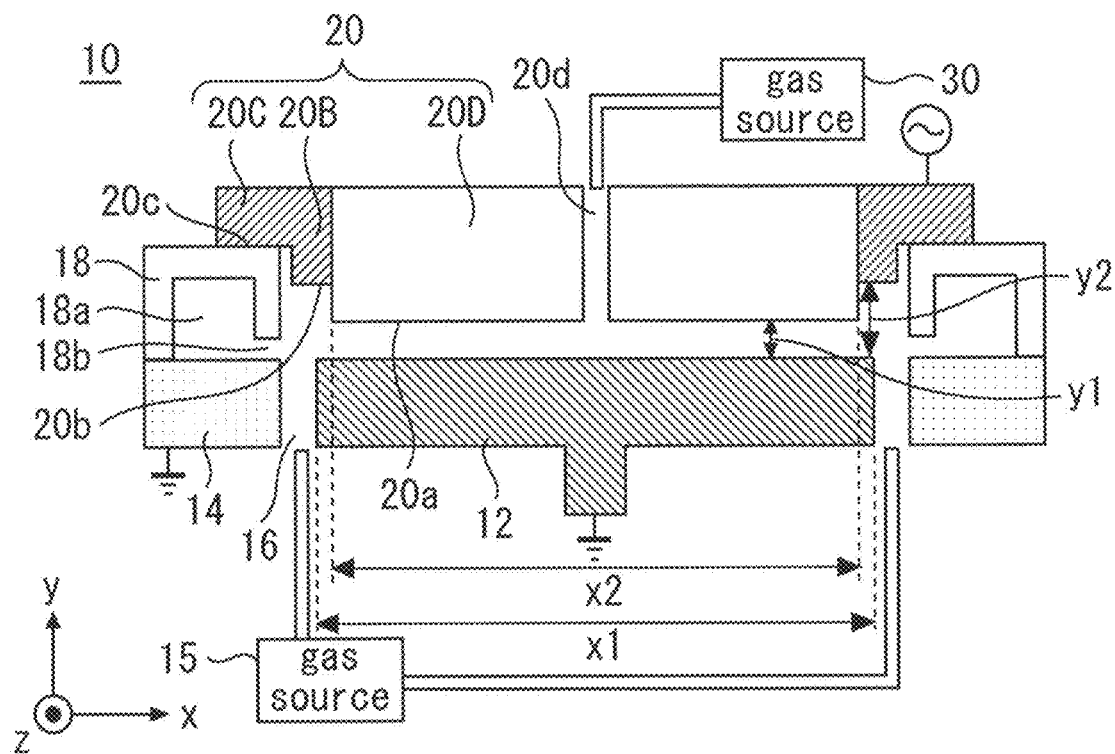
FIG. 11 is a cross-sectional view showing a substrate processing apparatus according to another example.

FIG. 11 is a cross-sectional view showing a substrate processing apparatus according to another example. The first part 20D of the upper electrode 20 is formed of an insulator, and the second part 20B is formed of metal or conductor. As a result, generation of plasma on the upper surface of the substrate can be suppressed while suppressing reaction gas from diffusing to the upper surface side of the substrate by inert gas.

Figure 12:
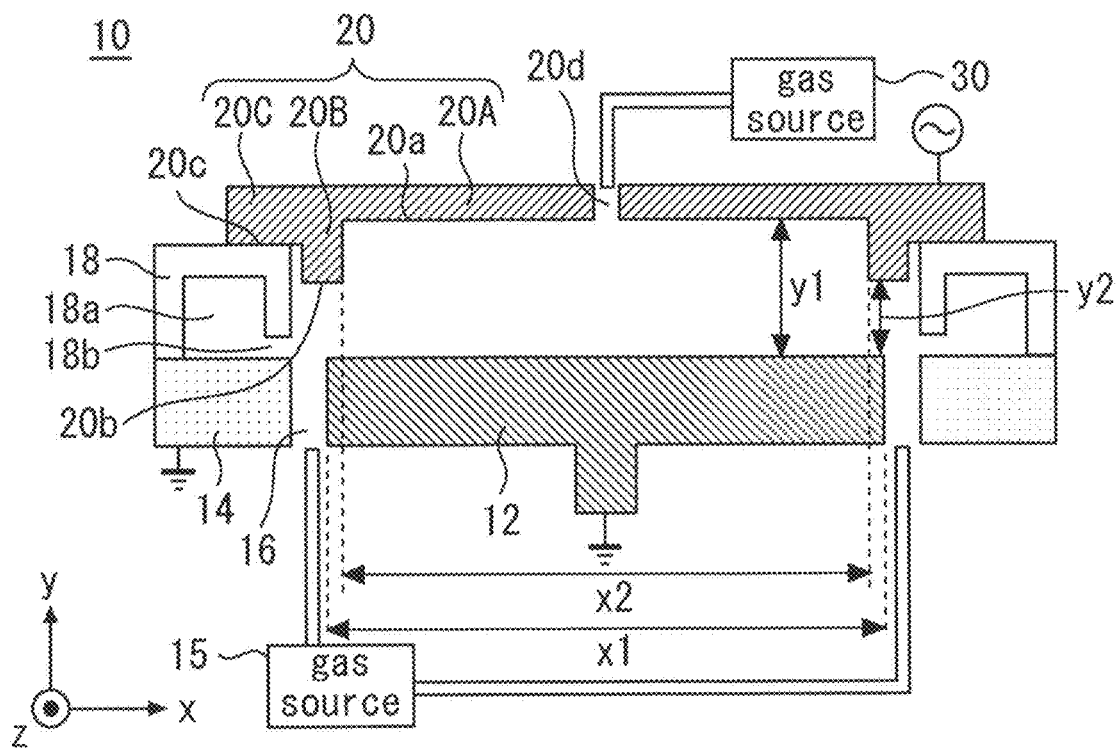
FIG. 12 is a cross-sectional view of a substrate processing apparatus according to another example.
Figure 13:
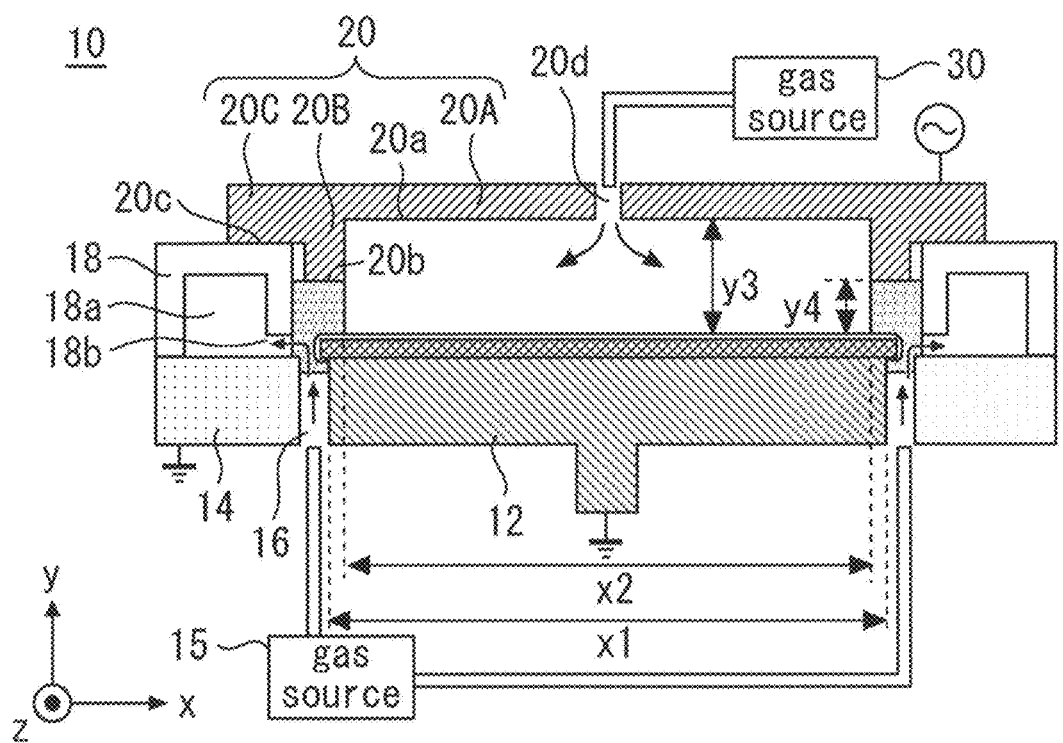
FIG. 13 is a diagram showing the plasma processing.

FIG. 12 is a cross-sectional view of a substrate processing apparatus according to another example. The second bottom surface 20b is at a lower position than the first bottom surface 20a. The position of the first bottom surface 20a is set to be higher than that of the first bottom surface 20a of FIG. 1 while the position of the second bottom surface 20b is set to the same as the second bottom surface 20b of FIG. 1. In this case, the distance between the first bottom surface 20a and the stage 12 is sufficiently increased to increase the value of pd in FIG. 6, whereby the ignition voltage $V_B$ increases, and thus generation of plasma just above the stage 12 can be suppressed. FIG. 13 is a diagram showing the plasma processing using the substrate processing apparatus of FIG. 12. By increasing the distance y3, generation of plasma just below the first bottom surface 20a can be suppressed, and plasma can be generated just below the second bottom surface 20b.

In the foregoing examples, the etching of the films on the side surface and back surface of the substrate has been mainly described. However, films may be formed on the side surface and back surface of the substrate by the substrate processing apparatus described above. When a stress film which is a film having internal stress is provided on the side surface and back surface of the substrate, there is a risk that the stress film may easily peel off from the substrate and become particles. Therefore, in order to relax the stress of the stress film as described above, a stress relaxing film can be formed on the stress film by using the substrate processing apparatus described above. The stress film is a carbon-based film such as a low-k film containing carbon, for example. The carbon-based film has tensile stress, and easily peels off. In this case, the stress relaxing film is formed on the stress film by a Si-based film using the substrate processing apparatus described above, whereby the stress can be relaxed and film peel-off can be suppressed.

There may be adopted an upper electrode having another shape which can make it easy to discharge in the neighborhood of the enclosing portion 40B, but difficult to discharge in the neighborhood of the center portion 40A.

As described above, the reaction gas can be prevented from diffusing from the outer peripheral side of the substrate to the inside of the substrate at least to some extent by performing the plasma processing while inert gas is made to flow radially from the position just above the center of the upper surface of the substrate. However, when generation of plasma is suppressed just above the center portion 40A of the substrate 40, supply of inert gas and the configuration required for supply of inert gas may be omitted.

The invention claimed is:

1. A substrate processing apparatus comprising:
a stage;
an outer peripheral ring that surrounds the stage while provided with a gap between a side surface of the stage and the outer peripheral ring;
a reaction gas source that contains a reaction gas and that supplies the reaction gas from a lower side of the gap to an upper side of the gap, such that all reaction gas provided to the apparatus is provided exclusively through the gap; and
an upper electrode provided above the stage.

2. The substrate processing apparatus according to claim 1, wherein
the upper electrode includes a first part having a first bottom surface confronting the stage, and a second part that surrounds the first part and has a second bottom surface.

3. The substrate processing apparatus according to claim 2, wherein
the first part and the second part are formed of metal, and the second bottom surface is at a higher position than the first bottom surface.

4. The substrate processing apparatus according to claim 2, wherein
the first bottom surface has a diameter ranging from a value larger than the diameter of the stage by 10 mm to a value smaller than the diameter of the stage by 10 mm.

5. The substrate processing apparatus according to claim 1, wherein
the stage has a diameter which is less than a diameter of the substrate.

6. The substrate processing apparatus according to claim 1, wherein
the stage and the outer peripheral ring are grounded, and a high frequency power source is connected to the upper electrode.

7. The substrate processing apparatus according to claim 1, further comprising
an exhaust duct that is provided above the outer peripheral ring, and surrounds the stage in plan view, wherein the exhaust duct provides an exhaust passage through which gas in a space surrounded by the exhaust duct is exhausted to an outside.

8. The substrate processing apparatus according to claim 1, wherein
an upper electrode through-hole penetrating through the upper electrode is formed just above a center of the stage.

9. The substrate processing apparatus according to claim 8, further comprising
an inert gas source that supplies inert gas downwards from an upper side of the upper electrode through-hole.

10. The substrate processing apparatus according to claim 2, wherein the first part is formed of an insulator, and the second part is formed of conductor.

11. The substrate processing apparatus according to claim 2, wherein the second bottom surface is at a lower position than the first bottom surface.

12. The substrate processing apparatus according to claim 1, wherein
the stage has an upper surface that directly supports a substrate, and
an upper surface of the outer peripheral ring is disposed at a same height as the upper surface of the stage.

13. The substrate processing apparatus according to claim 1, wherein
the outer peripheral ring does not overlap the stage in a plan view.

14. The substrate processing apparatus according to claim 1, wherein
the stage supports a substrate, and
the substrate directly contacts the stage without contacting the outer peripheral ring.

* * * * *